United States Patent
Chen et al.

(10) Patent No.: US 10,396,712 B2
(45) Date of Patent: Aug. 27, 2019

(54) TRANSFORMER FEED-BACK QUADRATURE VOLTAGE CONTROLLED OSCILLATOR FOR CORRECTING DYNAMIC PHASE ERROR AND COMMUNICATION APPARATUS USING THE SAME

(71) Applicant: NATIONAL CHUNG SHAN INSTITUTE OF SCIENCE AND TECHNOLOGY, Taoyuan (TW)

(72) Inventors: Hsiao-Chin Chen, Taipei (TW); Yen-Ting Chiang, New Taipei (TW); Chien-Te Yu, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 45 days.

(21) Appl. No.: 15/825,173

(22) Filed: Nov. 29, 2017

(65) Prior Publication Data
US 2019/0165729 A1   May 30, 2019

(51) Int. Cl.
| | |
|---|---|
| H03B 5/12 | (2006.01) |
| H03L 7/093 | (2006.01) |
| H03D 7/14 | (2006.01) |
| H04L 27/00 | (2006.01) |
| H03B 27/00 | (2006.01) |

(52) U.S. Cl.
CPC ......... *H03B 5/1212* (2013.01); *H03B 5/1218* (2013.01); *H03B 5/1228* (2013.01); *H03B 5/1265* (2013.01); *H03B 5/1296* (2013.01); *H03B 27/00* (2013.01); *H03D 7/1425* (2013.01); *H03L 7/093* (2013.01); *H04L 27/0014* (2013.01); *H03B 2200/009* (2013.01); *H03B 2200/0074* (2013.01); *H03B 2200/0078* (2013.01); *H04L 2027/0016* (2013.01)

(58) Field of Classification Search
CPC ..................................................... H03B 5/1212
USPC ..................................................... 331/17, 45
See application file for complete search history.

(56) References Cited

U.S. PATENT DOCUMENTS

| | | | | |
|---|---|---|---|---|
| 4,216,451 A | * | 8/1980 | Nishimura | H03J 3/185 257/296 |
| 6,137,372 A | * | 10/2000 | Welland | H03D 7/165 331/1 A |
| 2013/0207722 A1 | * | 8/2013 | Bulzacchelli | H03F 3/195 330/260 |

(Continued)

OTHER PUBLICATIONS

Majid Jalalifar—A Current-Reused Back-Gate Coupling QVCO Using Transformer Feedback Structure; IEEE Microwave and Wireless Components Letters, vol. 26, No. 7, Jul. 2016.

(Continued)

*Primary Examiner* — Joseph Chang
(74) *Attorney, Agent, or Firm* — Schmeiser, Olsen & Watts, LLP

(57) ABSTRACT

A transformer feed-back quadrature voltage controlled oscillator (QVCO) includes a first VCO; a second VCO; and a dynamic phase error correction circuit, having a plurality of coupling capacitors connected between the first and second VCOs, wherein the capacitances of the coupling capacitors are varied according to a digital control signal to correct a phase error of local oscillating (LO) signals of quadrature phases output by the first and second VCOs.

17 Claims, 13 Drawing Sheets

(56) References Cited

U.S. PATENT DOCUMENTS

2015/0280733 A1* 10/2015 Aboushady ........... H03M 3/408
341/143

OTHER PUBLICATIONS

Hong-Yeh Chang—K-Band CMOS Differential and Quadrature Voltage-Controlled Oscillators for Low Phase-Noise and Low-Power Applications; IEEE Transactions on Microwave Theory and Techniques, vol. 60, No. 1, Jan. 2012.

* cited by examiner

TRANSFORMER FEED-BACK QUADRATURE VOLTAGE CONTROLLED OSCILLATOR FOR CORRECTING DYNAMIC PHASE ERROR AND COMMUNICATION APPARATUS USING THE SAME

FIELD OF THE INVENTION

The present disclosure relates to a local oscillator used in a communication apparatus, and in particular to a transformer feed-back quadrature voltage controlled oscillator (QVCO) for correcting a dynamic phase error due to a coupling network of the transformer feed-back QVCO, and a communication apparatus using the transformer feed-back QVCO.

BACKGROUND OF THE INVENTION

With the development of the communication technology advances, the home-used communication devices are gradually replaced by the mobile communication devices, such as smart phone and pad computer, and smart appliances can comprise the communication apparatuses installed therein. The mobile communication devices and smart appliances perform wireless communications for an objective of data transmissions, and thus the era of internet-of-thing (IoT) comes in people life.

The wireless communication is implemented by a transceiver to transmit and receive the wireless signal on air. The transceiver usually has a frequency synthesizer for switching the carrier frequencies. For the demand of high communication quality, a stable and accurate local oscillating (LO) signal is imperatively required since this can make the wireless signal be accurately transmitted to a wireless receiver. Thus, the low phase noise voltage controlled oscillator (VCO) is an important electrical component in the transceiver.

Now, a standard of $5^{th}$ generation (5G) mobile communication is developing, and compared with the previous generation mobile communication, 5G mobile communication provides a higher network capacity, a higher data transmission rate, a more robust communication ability and a lower wireless transmission delay. Additionally, the standard of 5G mobile communication specifies a radio frequency (RE) from 38.6 GHz through 40 GHz.

Referring to FIG. 1, FIG. 1 is a block diagram of a conventional transceiver used in 5G mobile communication. The conventional transceiver 1 comprises a modulator 11, sub-harmonic mixers 12, 17, a power amplifier (PA) 13, a transmitting/receiving-switch (TR-SW) 14, an antenna 15, a low noise amplifier (LNA) 16, a demodulator 18 and a phase locked loop (PLL) 19. The sub-harmonic mixer 12 is connected to the modulator 11, the PLL 19 and the PA 13. The TR-SW 14 is connected to the PA 13, the LNA 16 and the antenna 15. The sub-harmonic mixer 17 is connected to the demodulator 18, the PLL 19 and the LNA 16.

The modulator 11 receives and modulates a first data signal $D_{in}$ to generate a first intermediate frequency (IF) signal of about 3.5 GHz. The PLL 19 provides a LO signal to the sub-harmonic mixers 12 and 17. The sub-harmonic mixer 12 mixes the first IF signal and the LO signal to generate a first RF signal to the PA 13. The PA 13 receives and amplifies the first RF signal, and the TR-SW is switched to the PA 13, such that antenna 15 can radiate the first amplified RF signal to air.

The antenna 15 can receive a second RF signal from air, and the TR-SW is switched to the LNA 16, such that the LNA 16 can amplify the second RF signal. The sub-harmonic mixer 17 mixes the second amplified RF signal and the LO signal to generate a second IF signal of about 3.5 GHz. The demodulator 18 receives and demodulates the second IF signal to generate a second data signal $D_{out}$.

In the standard of 5G mobile communication, the RF is specified from 38.6 GHz through 40 GHz, and the RF can be expressed as RF=2LO+IF. Thus, the LO should be designed in the range of 17.55 GHz through 18.25 GHz. To prevent process variation or other effecting factor, the range of the LO can be extended from 17.2 GHz through 18.6 GHz, so as to meet the standard of 5G mobile communication.

In addition to that the PLL is used to generate the LO signal, a conventional QVCO can be also used to generate LO signals of quadrature phases, but the conventional QVCO has a coupling network is connected to output ends thereof, such that the output load is increased, and the maximum operating frequency is decreased. Furthermore, the current passive coupling network may induce phase offsets at different frequencies due to an ultrawide operating band.

SUMMARY OF THE INVENTION

An objective of the present disclosure is to provide a transformer feed-back QVCO which has a dynamic phase error correction circuit for a coupling network of the transformer feed-back QVCO.

Another one objective of the present disclosure is to provide a transformer feed-back QVCO to generate LO signals of quadrature phases of about 18 GHz, so as to decrease the output load of the transformer feed-back QVCO, and to simultaneously increase the maximum operating frequency of the transformer feed-back QVCO. The transformer feed-back QVCO can meet the requirement of the frequency synthesizer of 5G mobile communication, and further installed in a handheld device.

To achieve at least the above objective, the present disclosure provides transformer feed-back quadrature voltage controlled oscillator (QVCO), comprising: a first VCO; a second VCO; and a dynamic phase error correction circuit, having a plurality of coupling capacitors connected between the first and second VCOs, wherein the capacitances of the coupling capacitors are varied according to a digital control signal to correct a phase error of local oscillating (LO) signals of quadrature phases output by the first and second VCOs.

To achieve at least the above objective, the present disclosure provides a communication apparatus comprising: the above transformer feed-back QCVO; and a front-end circuit, connected to the transformer feed-back QCVO.

In an embodiment of the present disclosure, the transformer feed-back quadrature voltage controlled oscillator is formed by a first half circuit and a second half circuit, wherein each of the first and second half circuit comprises: a first coupling capacitor; a second coupling capacitor; an induction inductor; a NMOS transistor; a PMOS transistor; and a frequency tuning circuit, a first end thereof is connected to a first end of the induction inductor, a drain of the PMOS transistor and a gate of the NMOS transistor, and a second end thereof is connected to a second end of the induction inductor, a drain of the NMOS transistor and a gate of the PMOS transistor; wherein the induction inductors of the first and second half circuit form a transformer, a body of the PMOS transistor of the first half circuit is connected to a source of the PMOS transistor of the second half circuit through the first coupling capacitor of the first half circuit, a body of the NMOS transistor of the first half circuit is connected to a source of the NMOS transistor of the second half circuit through the second coupling capacitor of the first half circuit, a body of the PMOS transistor of the second half circuit is connected to a source of the NMOS transistor of the first half circuit through the first coupling capacitor of the second half circuit, a body of the NMOS transistor of the second half circuit is connected to a source of the PMOS transistor of the first half circuit through the second coupling capacitor of the second half circuit, the drains of the PMOS transistors and the NMOS transistors are used to output the local oscillating (LO) signals of the quadrature phases, and a LO frequency is determined by a frequency tuning voltage applied to the frequency tuning circuit based upon a frequency-voltage curve; wherein the first and second coupling capacitors of the first and second half circuits are the variable coupling capacitors of the dynamic phase error correction circuit, so as to form the dynamic phase error correction circuit, the NMOS transistor, the PMOS transistor and the induction inductor of the first half circuit form the first VCO, and the PMOS transistor and the induction inductor of the second half circuit form the second VCO.

In an embodiment of the present disclosure, each of the first half circuit and the second half circuit further comprises: a switching capacitor device, a first end thereof is connected to the first end of the frequency tuning circuit, and a second end thereof is connected to the second end of the frequency tuning circuit, wherein a code which is given to the switching capacitor is used to shift the frequency-voltage curve.

In an embodiment of the present disclosure, each of the first half circuit and the second half circuit further comprises: a first inductor, wherein the source of the PMOS transistor is connected to a system voltage through the first inductor; and a second inductor, wherein the source of the NMOS transistor is connected to a ground through the second inductor.

In an embodiment of the present disclosure, the frequency tuning comprises: a first and second variable capacitors; a first and second resistors; and a first and second capacitors; wherein the frequency tuning voltage is applied to first ends of the first and second variable capacitors, a second end of the first variable capacitor is connected to second ends of the first resistor and the first capacitor, a second end of the second variable capacitor is connected to second ends of the second resistor and the second capacitor, a biasing voltage is applied to first ends of the first and second resistors, and first ends of the first and second resistors are respectively connected to the drains of the PMOS and NMOS transistors.

In an embodiment of the present disclosure, when the frequency tuning voltage increases, a capacitance of the first variable capacitor increases, and a capacitance of the second variable capacitor decreases.

In an embodiment of the present disclosure, the switching capacitor device comprises: switches and capacitors, wherein each of switches is connected between two capacitors, each set of the switch and the corresponding capacitors is parallelly connected to other one set, and the code is used to turned on or off at least one of the switches.

In an embodiment of the present disclosure, a LO frequency is 17.2 GHz through 18.6 GHz.

In an embodiment of the present disclosure, the phase noise is about −110 dBc/Hz at a frequency offset being 1 MHz.

In an embodiment of the present disclosure, the communication apparatus further comprises: an antenna, connected to the front-end circuit, wherein the front-end circuit is a transceiver circuit, a receiver circuit or a transmitter circuit.

To sum up, compared with the conventional QVCO, the transformer feed-back QVCO can correct the phase error of the LO signals of quadrature phases due to the coupling network of the transformer feed-back QVCO. In addition, the transformer feed-back QVCO can have a lower output load, a higher operating frequency, and a lower phase noise, and further have a wider operating band while the switching capacitor devices are used.

DETAILED DESCRIPTION OF THE PREFERRED EMBODIMENTS

Figure 1:
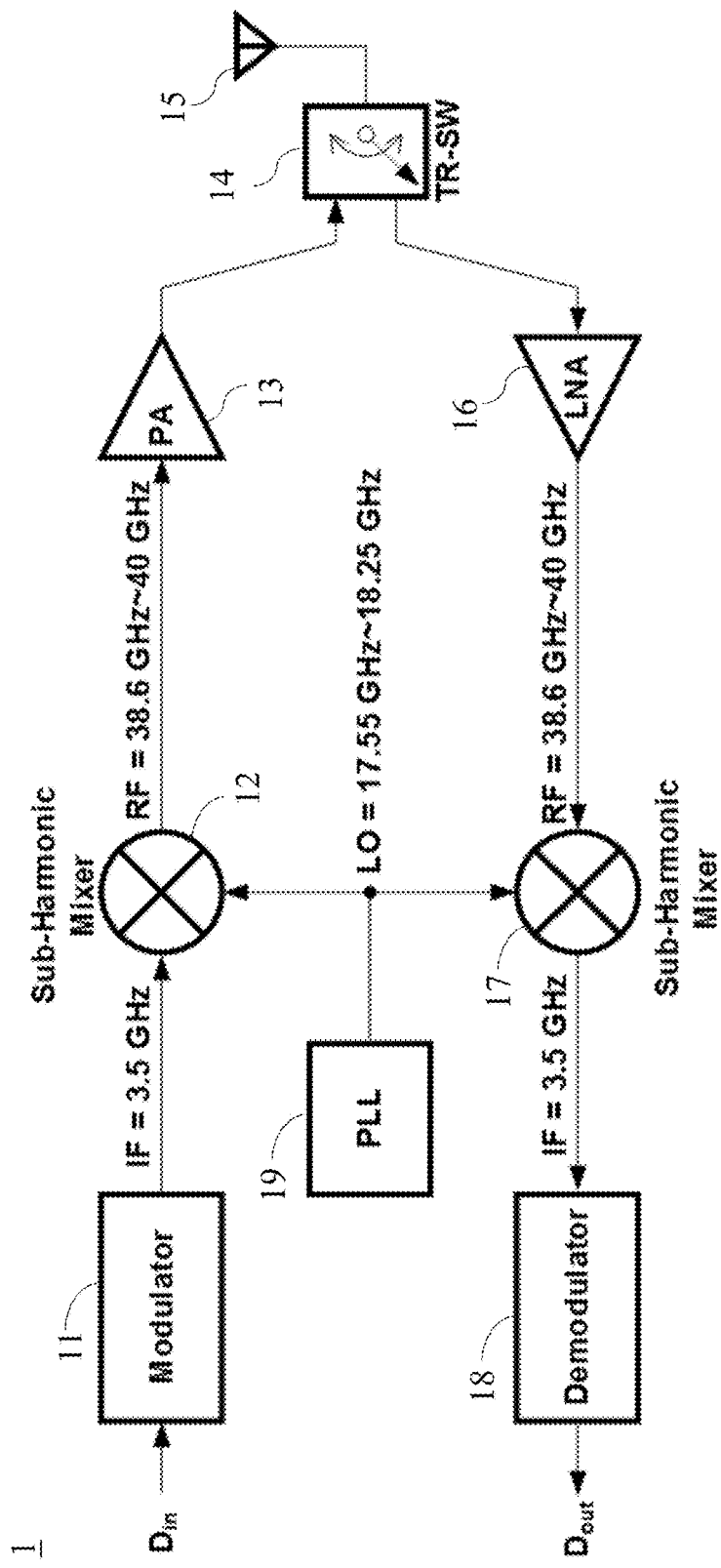
FIG. 1 is a block diagram of a conventional transceiver used in 5G mobile communication.

To make it easier for the examiner to understand the objects, characteristics and effects of this present disclosure, embodiments together with the attached drawings for the detailed description of the present disclosure are provided.

An embodiment of the present disclosure provides a transformer feed-back QVCO comprising a first half circuit and a second half circuit. Each of the of the first and the second half circuits has an induction inductor of the transformer to form the transformer feed-back structure. A frequency tuning circuit in each of the first and second half circuits is formed in circuit interior of the transformer feed-back QVCO rather than on output ends of the transformer feed-back QVCO.

Furthermore, a body of a PMOS transistor of the first half circuit is connected to a source of a PMOS transistor of the second half circuit through a first coupling capacitor of the first half circuit, and a body of a NMOS transistor of the first half circuit is connected to a source of a NMOS transistor of the second half circuit through a second coupling capacitor of the first half circuit. A body of the PMOS transistor of the second half circuit is connected to a source of the NMOS transistor of the first half circuit through a first coupling capacitor of the second half circuit, and a body of the NMOS transistor of the second half circuit is connected to a source of the PMOS transistor of the first half circuit through a second coupling capacitor of the second half circuit.

By the body-source capacitor coupling manner, the transformer feed-back QCVO can generate the LO signals of quadrature phases. The frequency tuning circuits in fact are circuit components of a coupling network. Since the frequency tuning circuits are formed in the circuit interior of the transformer feed-back QVCO rather than on output ends of the transformer feed-back QVCO, a maximum operating frequency of the transformer feed-back QCVO is increased, and an output load of the transformer feed-back QCVO is decreased.

It is noted that the induction inductor, the PMOS and NMOS transistors of the first half circuit in fact form a VCO, the induction inductor, the PMOS and NMOS transistors of the second half circuit in fact form another one VCO, and the first and second coupling transistors of the first and second half circuits form a dynamic phase error correction circuit for the coupling network of the transformer feed-back QVCO.

Moreover, the frequency tuning circuits are used to determine the LO frequency according to a frequency tuning voltage applied to the frequency tuning circuits based a frequency-voltage curve. Each of the first half circuit and the second half circuit can further comprise a switching capacitor device which is also circuit components of the coupling network formed in the circuit interior of the transformer feed-back QVCO. The switching capacitor devices can correct phase offsets at different frequencies due to an ultrawide operating band by shifting the frequency-voltage curve in accordance with the codes which are given to the switching capacitor devices.

Figure 2:
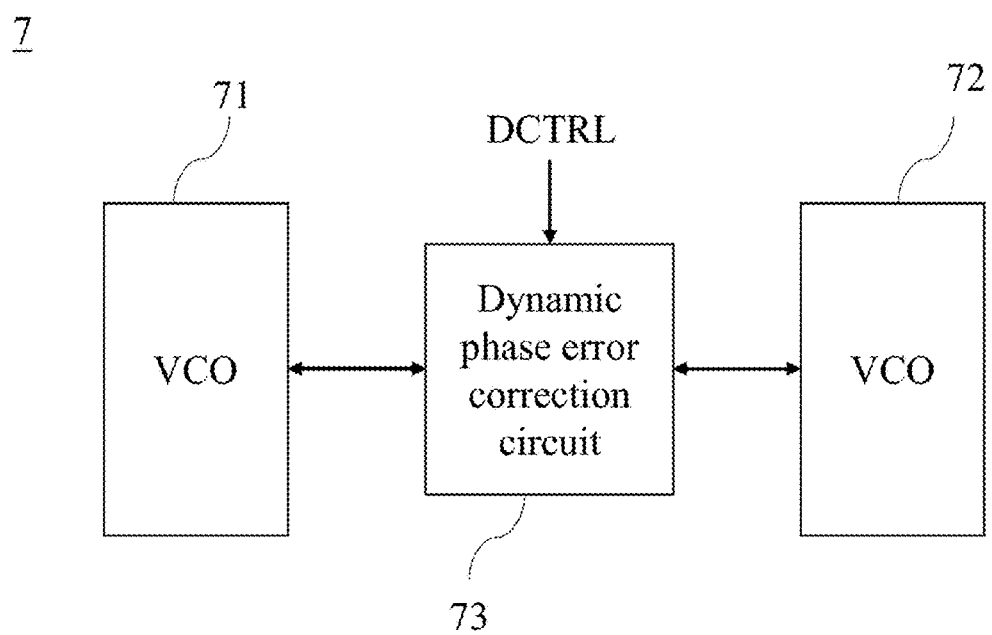
FIG. 2 is a block diagram of a transformer feed-back QVCO according to an embodiment of the present disclosure.

Details of the transformer feed-back QVCO are illustrated as follows. Referring to FIG. 2, FIG. 2 is a block diagram of a transformer feed-back QVCO according to an embodiment of the present disclosure. The transformer feed-back QVCO 7 has two VCOs 71, 72 and a dynamic phase error correction circuit 73, wherein the dynamic phase error correction circuit 73 comprises coupling capacitors connected between the two VCOs 71, 72, and the capacitances of the coupling capacitors can be controlled by a digital control signal DCTRL.

The two different signals output by the two VCOs 71, 72 can be used to generate the LO signals of quadrature phases through the coupling network of the transformer feed-back QVCO 7. However, due to the process tolerance, the two VCOs 71, 72 may have the mismatch, such that offsets of the quadrature phases may exist to form the steady-state phase error.

While high accuracy is demanded, the steady-state phase error should be corrected. While the capacitances of the coupling capacitors are changed, the phase error of the LO signals of quadrature phases is increased or decreased, so as to correct the phase error of the LO signals of quadrature phases.

Figure 3:
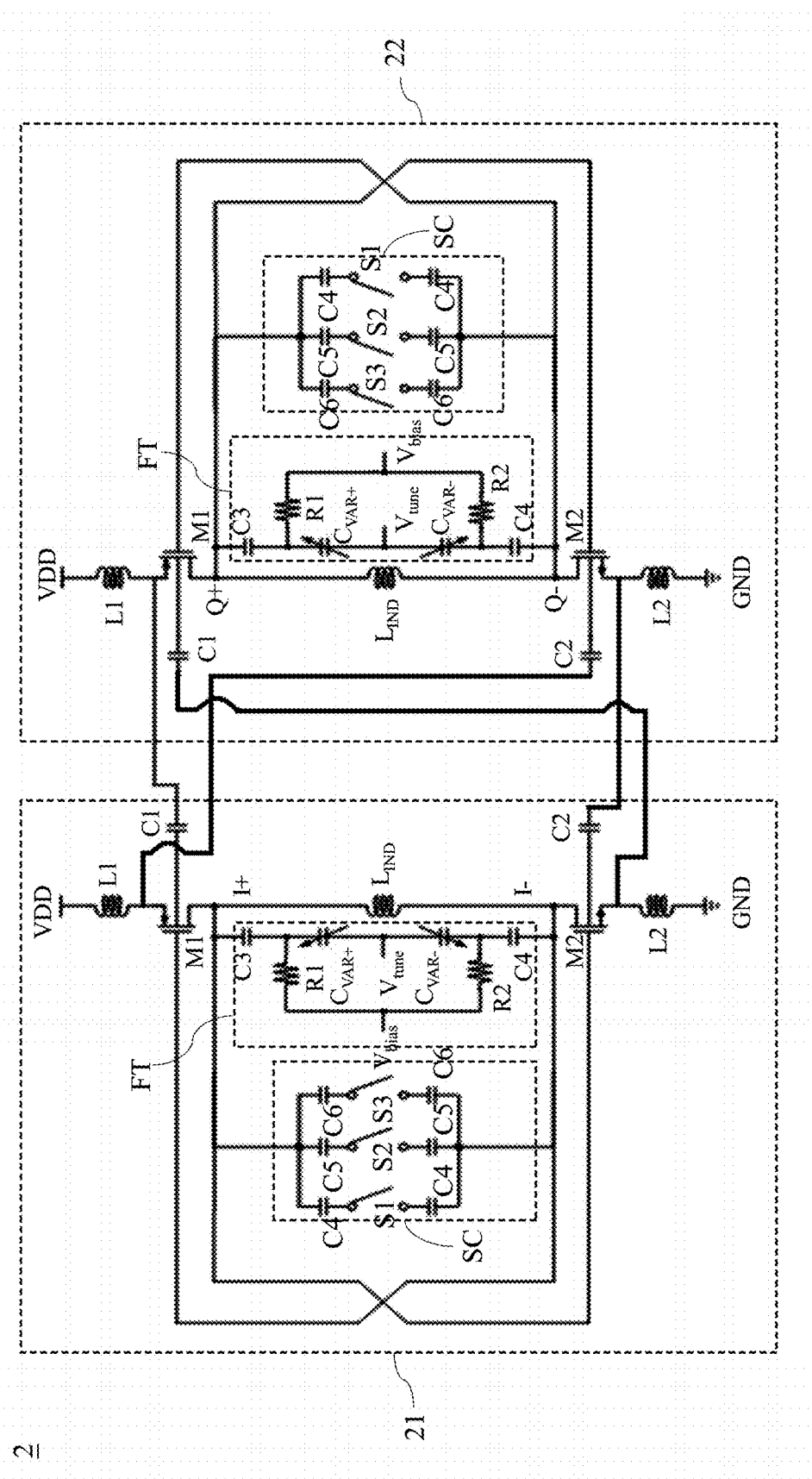
FIG. 3 is a circuit diagram of a transformer feed-back QVCO according to an embodiment of the present disclosure.
Figure 4A:
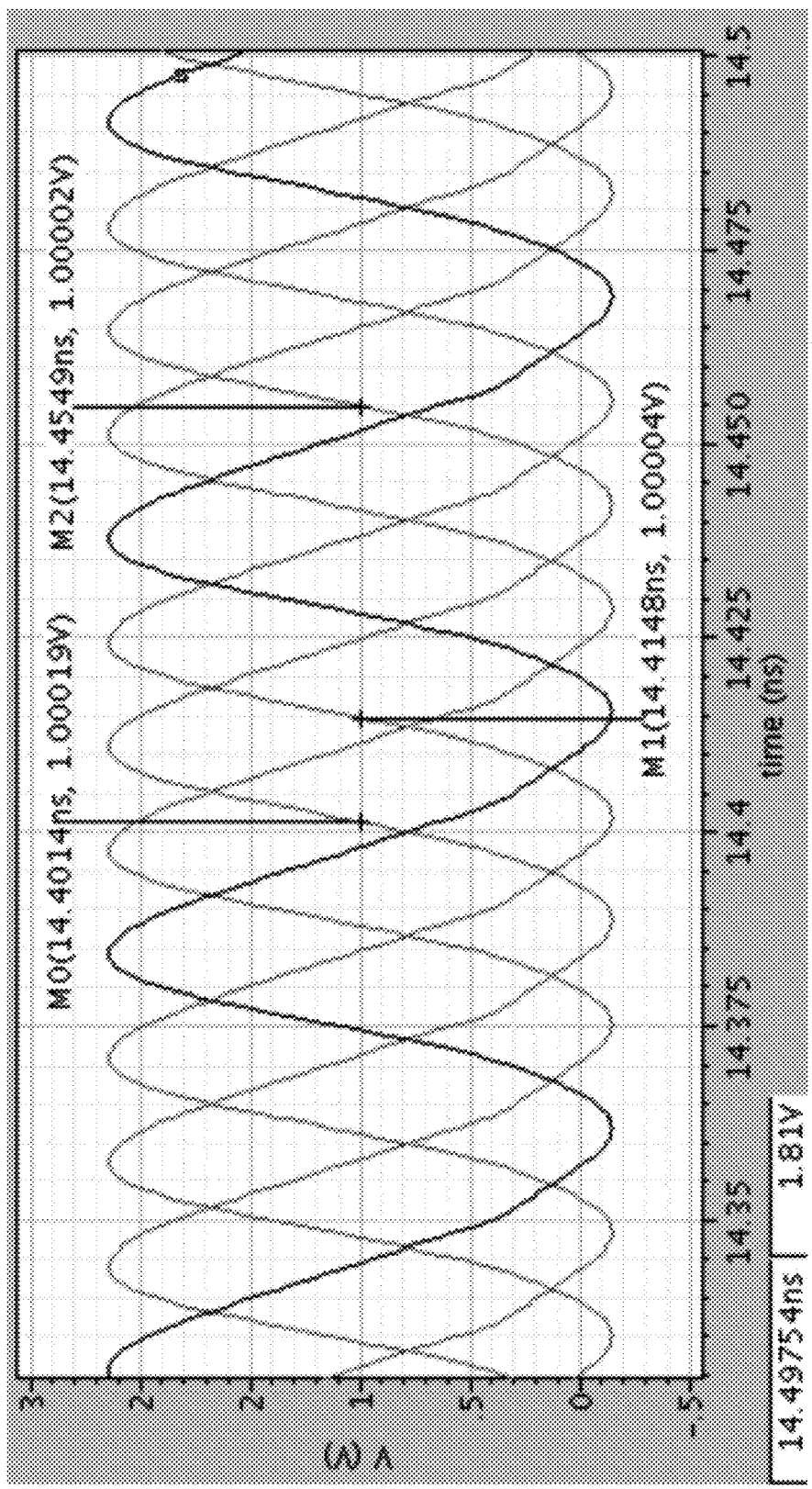
FIG. 4A is a curve diagram showing the LO signals of the quadrature phases of the associated with the transformer feed-back QVCO at different ratios of the coupling capacitors according one embodiment of the present disclosure.
Figure 4B:
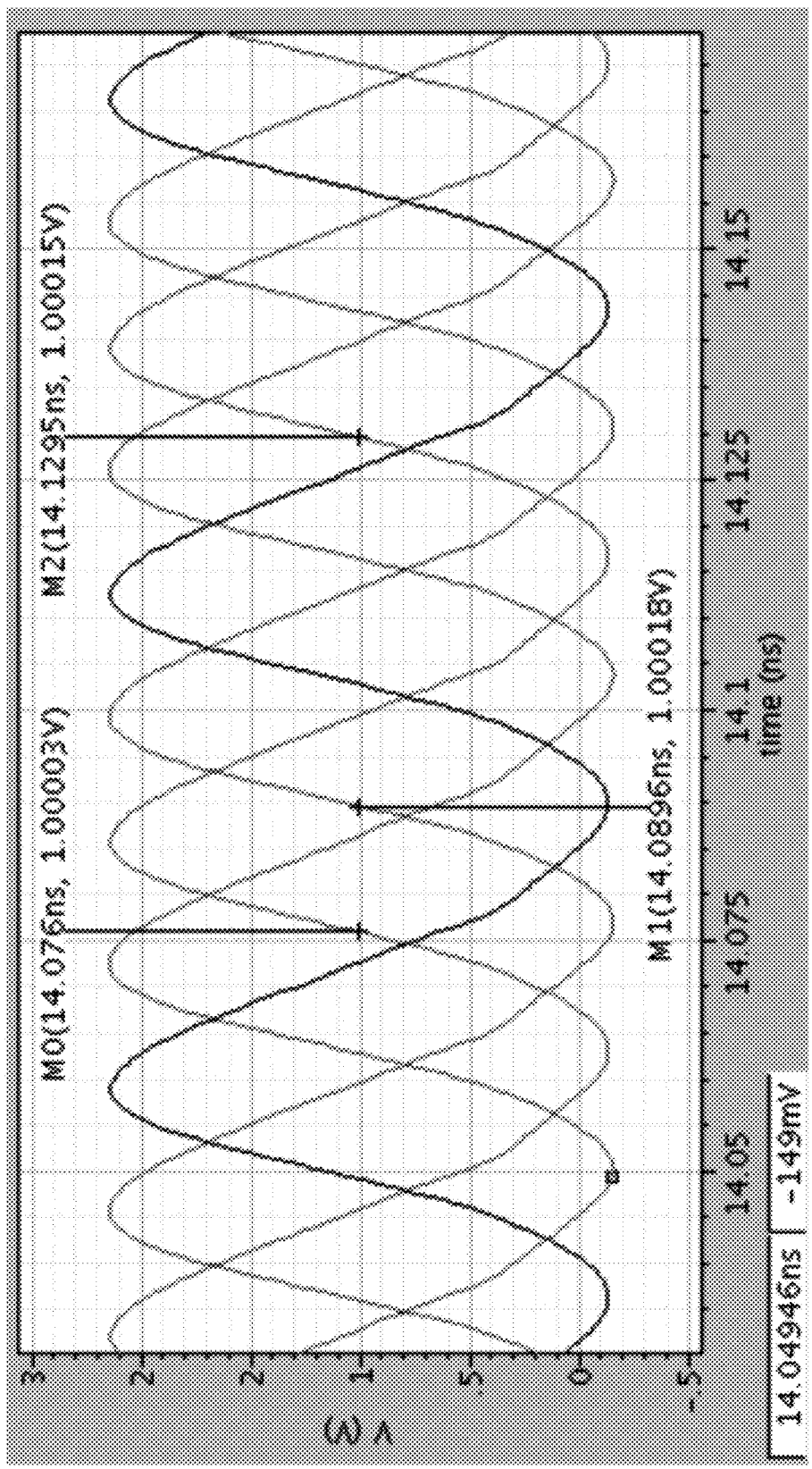
FIG. 4B is a curve diagram showing the LO signals of the quadrature phases of the associated with the transformer feed-back QVCO at different ratios of the coupling capacitors according one embodiment of the present disclosure.
Figure 4C:
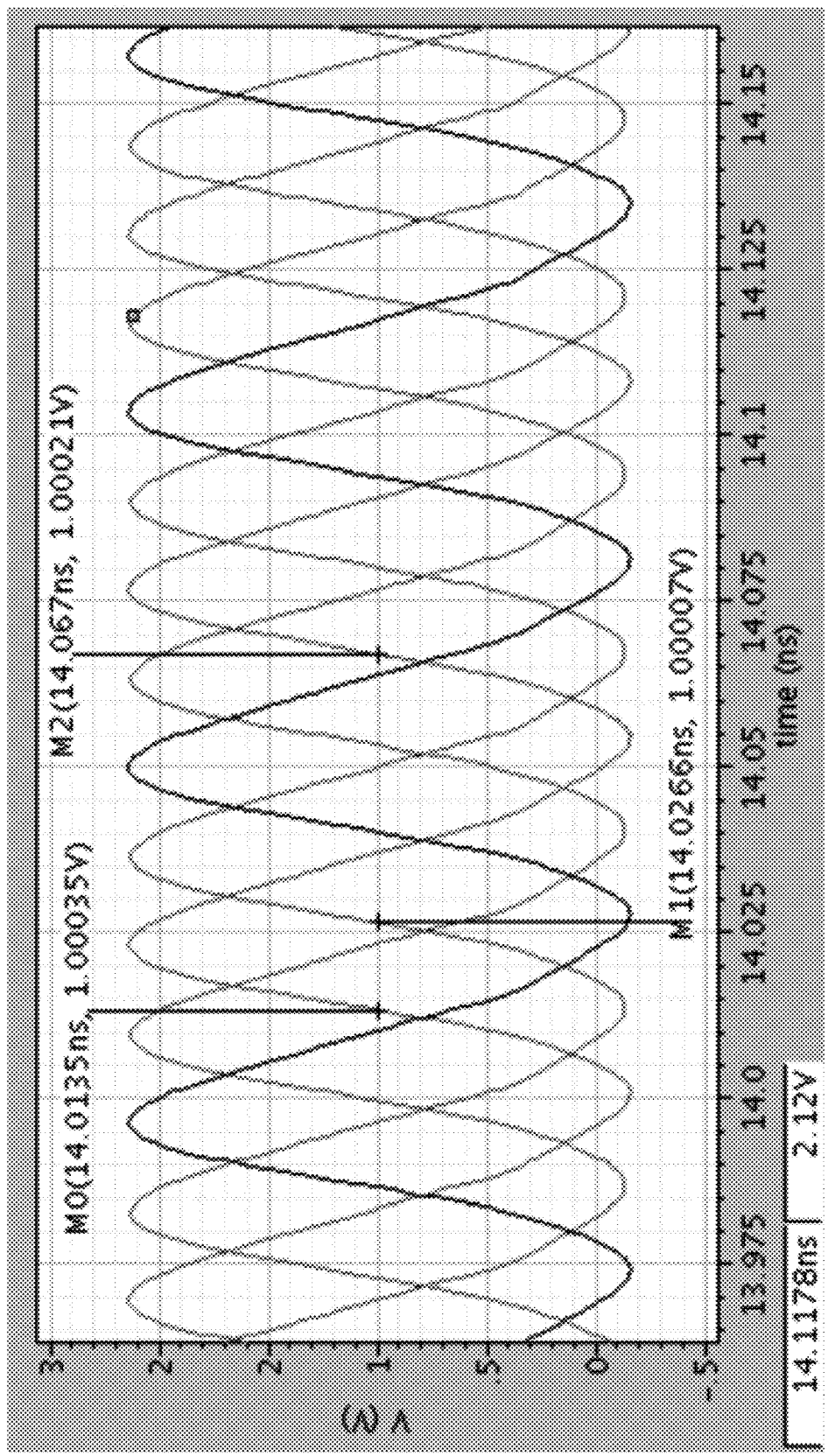
FIG. 4C is a curve diagram showing the LO signals of the quadrature phases of the associated with the transformer feed-back QVCO at different ratios of the coupling capacitors according one embodiment of the present disclosure.
Figure 4D:
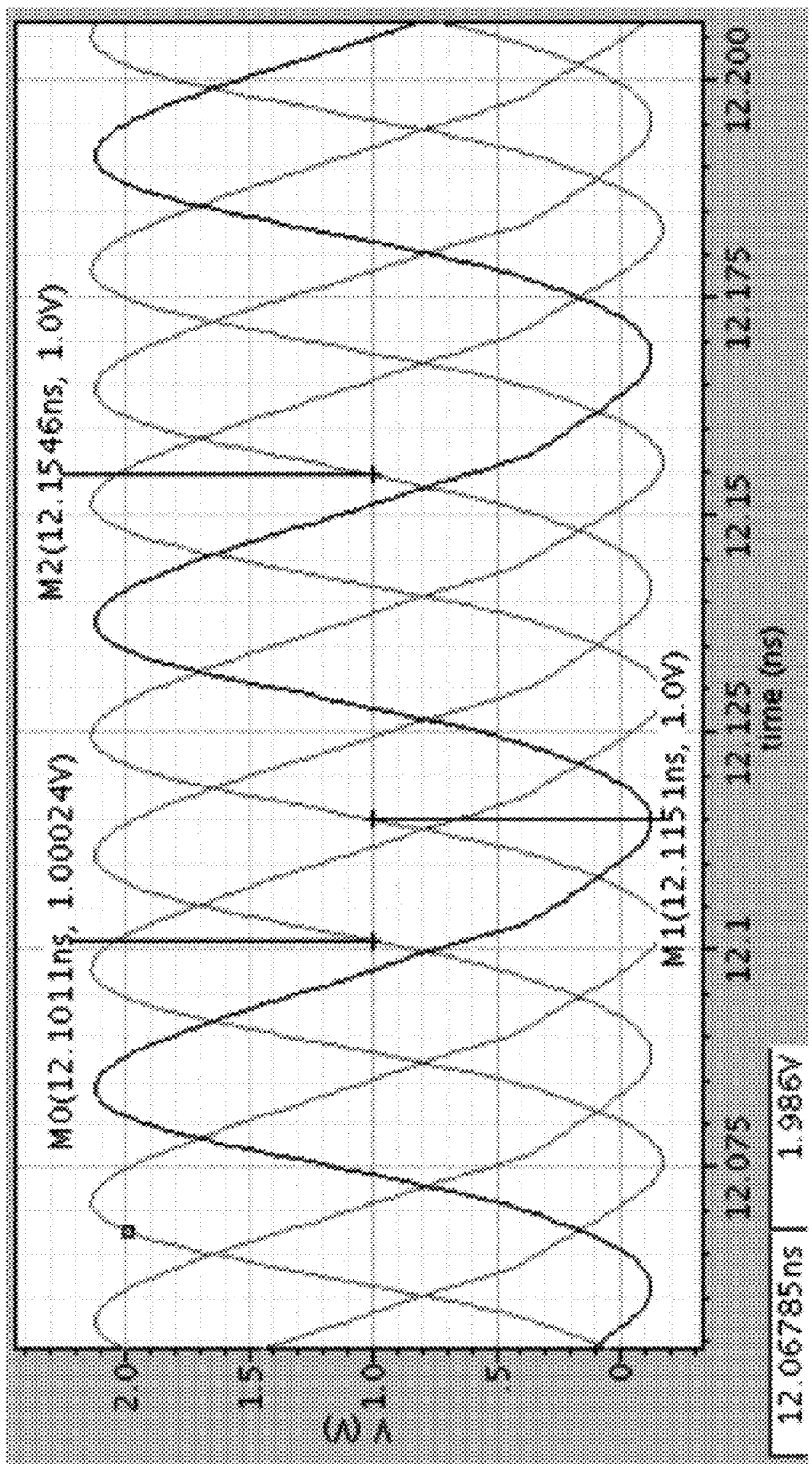
FIG. 4D is a curve diagram showing the LO signals of the quadrature phases of the associated with the transformer feed-back QVCO at different ratios of the coupling capacitors according one embodiment of the present disclosure.
Figure 4E:
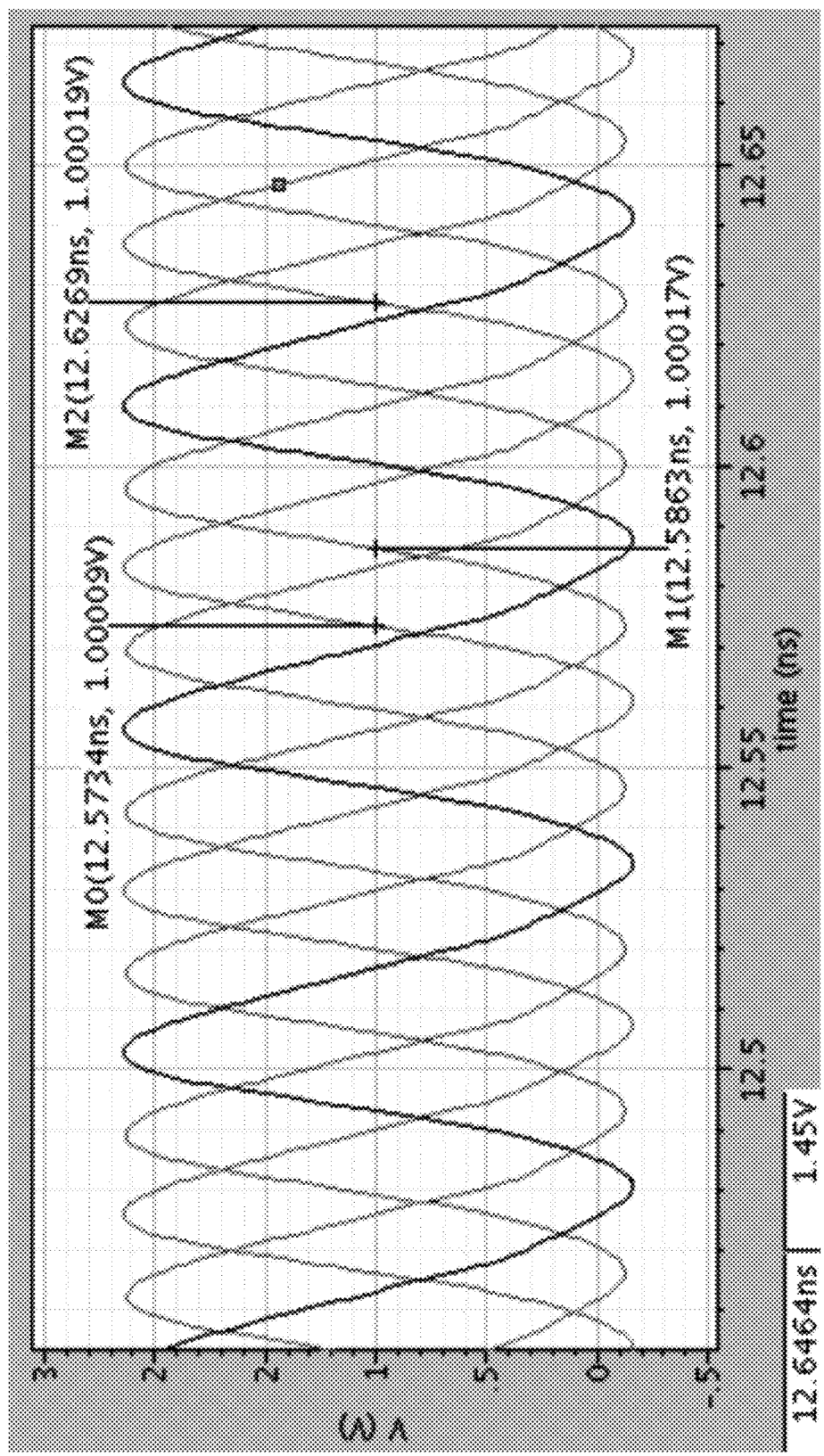
FIG. 4E is a curve diagram showing the LO signals of the quadrature phases of the associated with the transformer feed-back QVCO at different ratios of the coupling capacitors according one embodiment of the present disclosure.

Next, referring to FIG. 3, FIG. 3 is a circuit diagram of a transformer feed-back QVCO according to an embodiment of the present disclosure. The transformer feed-back QVCO 2 is formed by a first half circuit 21 and a second half circuit 22, wherein the second half circuit 21 is connected to the first half circuit 21, and the circuit components of first half circuit 21 are the same as those of the second half circuit 22.

Each of the first and second half circuits 21, 22 comprises a PMOS transistor M1, a NMOS transistor M2, inductors L1, L2, an induction inductor $L_{IND}$, a switching capacitor device SC, a frequency tuning circuit FT, and coupling capacitors C1, C2. In each of the first and second half circuits 21, 22, sources of the PMOS and NMOS transistors M1, M2 are respectively connected to a system voltage VDD and a ground GND through the inductors L1 and L2, bodies of the PMOS and NMOS transistors M1, M2 are respectively connected to first ends of the coupling capacitors C1, C2, a drain of the PMOS transistor M1 is connected to a gate of the NMOS transistor M2 and first ends of the induction inductor $L_{IND}$, the switching capacitor device SC and the frequency tuning circuit FT, and a drain of the NMOS transistor M2 is connected to a gate of the PMOS transistor M1 and second ends of the induction inductor $L_{IND}$, the switching capacitor device SC and the frequency tuning circuit FT. The induction inductors $L_{IND}$ of the first half circuit 21 and a second half circuit 22 are coupled to each other (i.e. the induction inductors $L_{IND}$ form a transformer), by the above connection manner, a transformer feed-back structure is formed.

The transformer feed-back structure can increase output amplitudes and decrease the phase noise, and the above connection manner further forms a current reuse structure for decreasing the phase noise and eliminating secondary harmonic signals of the source of the PMOS and NMOS transistors M1, M2.

The sources of the PMOS and NMOS transistors M1, M2 of the second half circuit 22 are respectively connected to second sends of the coupling transistor C1 and C2 of the first half circuit, and the sources of the PMOS and NMOS transistors M1, M2 of the first half circuit 21 are respectively connected to second sends of the coupling transistor C2 and C1 of the first half circuit, such that the body-source capacitor coupling manner can make the transformer feed-back QVCO generate the LO signals I+, I−, Q+, Q− of quadrature phases.

It is noted that, by the above connection manner, the switching capacitor devices SC and the frequency tuning circuits FT form a coupling network in circuit interior of the transformer feed-back QVCO 2 rather than on output ends of the transformer feed-back QVCO 2, such that the output load of the transformer feed-back QVCO 2 can be decreased, and the maximum operating frequency of the transformer feed-back QVCO 2 can be increased.

The frequency tuning circuits FT are used to determine the LO frequency of the LO signals I+, I−, Q+, Q− of quadrature phases according to a frequency tuning voltage $V_{tune}$ based on a frequency-voltage curve which is substantially logarithm linear within the operating band, for example, 17.7 GHz through 18.6 GHz for 5G mobile communication. That is, the LO frequency is increased when the frequency tuning voltage $V_{tune}$ is increased.

The switching capacitor devices SC are used to shift the frequency-voltage curve according to the code (i.e. control signals of switches S1, S2, S3) given to the switching capacitor devices SC. Thus, the switching capacitor devices SC can increase the logarithm linear range of the frequency-voltage curve, and correct the phase offsets at the different frequencies due to the ultrawide operating band.

Details of each of the frequency tuning circuits FT are illustrated as follows, and the following implementation of the frequency tuning circuits FT are not used to limit the present disclosure. The frequency tuning circuit FT comprises capacitors C3, C4, resistors R1, R2, a first variable capacitor $C_{VAR+}$ and a second variable capacitor $C_{VAR-}$. A frequency tuning voltage $V_{tune}$ is applied to first ends of the first and second variable capacitors $C_{VAR+}$, $C_{VAR-}$, and a bias voltage $V_{bias}$ is applied to first ends of the resistors R1, R2. A second end of the resistor R1 is connected to second ends of the first variable capacitor $C_{VAR+}$ and the capacitor C3, and a second end of the resistor R2 is connected to second ends of the second variable capacitor $C_{VAR-}$ and the capacitor C4. First ends of the capacitors C3, C4 are connected to the first and second ends of the frequency tuning circuit FT respectively (i.e. the drain ends of the PMOS and NMOS transistors M1, M2).

The first variable capacitor $C_{VAR+}$ and the second variable capacitor $C_{VAR-}$ can vary their capacitance according to the frequency-tuning voltage $V_{tune}$, such that the LO frequency can be varied according to the frequency-tuning voltage $V_{tune}$. It is noted that the first variable capacitor $C_{VAR+}$ increases its capacitance when the frequency-tuning voltage $V_{tune}$, increases, while the second variable capacitor $C_{VAR-}$ decreases its capacitance when the frequency-tuning voltage $V_{tune}$, increases. However, the design of the first variable capacitor $C_{VAR+}$ and the second variable capacitor $C_{VAR-}$ is not used to limit the present disclosure.

Details of each of the switching capacitor devices SC are illustrated as follows, and the following implementation of the switching capacitor devices SC are not used to limit the present disclosure. The switching capacitor device SC can comprise a plurality of capacitors C4 through C6 and a plurality of switches S1 through S3. The switch S1 are connected between two first ends the two capacitors C4, the switch S2 are connected between two first ends the two capacitors C5, and the switch S3 are connected between two first ends the two capacitors C6. Second ends the upper capacitors C4 through C6 are connected to the first end of the switching capacitor device SC (i.e. the drain end of the PMOS transistor M1), and second ends the lower capacitors C4 through C6 are connected to the second end of the switching capacitor device SC (i.e. the drain end of the NMOS transistor M2).

The code formed by control signals are used to turned on or off at least one of the switches S1 through S3, such that an equivalent capacitance of the switching capacitor device SC can be varied. Since the equivalent capacitance of the switching capacitor device SC can be varied, the frequency-voltage curve of the transformer feed-back QVCO 2 can be shifted, and equivalently, multiple frequency-voltage curves are provided. It is noted that, the wide logarithm linear range is not required, the switching capacitor devices SC can be removed from the transformer feed-back QVCO 2.

It is noted that the induction inductor $L_{IND}$ and the PMOS transistor M1 and the NMOS transistor M2 of the first half circuit 21 form a VCO (such as, the VCO 71 in FIG. 2), the induction inductor $L_{IND}$ and the PMOS transistor M1 and the NMOS transistor M2 of the second half circuit 21 form another one VCO (such as, the VCO 72 in FIG. 2), and the coupling capacitors C1 and C2 of the first half circuit 21 and the second half circuit 22 form the dynamic phase error correction circuit (such as, the dynamic phase error correction circuit 73 in FIG. 2). The two different signals output by the two VCOs can be used to generate the LO signals I+, I−, Q+, Q− of quadrature phases through the coupling network. However, due to the process tolerance, the two VCOs may have the mismatch, such that offsets of the quadrature phases may exist to form the steady-state phase error.

While high accuracy is demanded, the steady-state phase error should be corrected. The coupling capacitors C1 and C2 of the first half circuit 21 and the second half circuit 22 are the variable coupling capacitors which form the dynamic phase error correction circuit for the coupling network of the transformer feed-back QVCO. While the ratio of the coupling capacitors C1 and C2 is changed, the phase error of the LO signals I+, Q+(or I−, Q−) of quadrature phases is increased or decreased.

Referring to FIG. 4A through FIG. 4E, FIG. 4A through FIG. 4E are curve diagrams showing the LO signals of the quadrature phases of the associated with the transformer feed-back QVCO at different ratios of the first and second coupling capacitors according one embodiment of the present disclosure. For example, in FIG. 4A, the ratio of the coupling capacitors C1 and C2 is about 1 (i.e. 157 fF/157 fF) being operated at 18.69 GHz, and the phase error is about 0.168; in FIG. 4B, the ratio of the coupling capacitors C1 and C2 is about 2 (i.e. 314 fF/157 fF) being operated at 18.69 GHz, and the phase error is about 1.514; in FIG. 4C the ratio of the coupling capacitors C1 and C2 is about ½ (i.e. 157 fF/314 fF) being operated at 18.69 GHz, and the phase error is about −1.85; in FIG. 4D, the ratio of the coupling capacitors C1 and C2 is about 4 (i.e. 628 fF/314 fF) being operated at 18.69 GHz, and the phase error is about 4.206; and in FIG. 4E, the ratio of the coupling capacitors C1 and C2 is about ¼ (i.e. 157 fF/628 fF) being operated at 18.69 GHz, and the phase error is about −3.196. Accordingly, the adjustment of the ratio of the coupling capacitors C1 and C2 can correct the steady-state phase error due to the mismatch of the two VCOs.

Figure 5A:
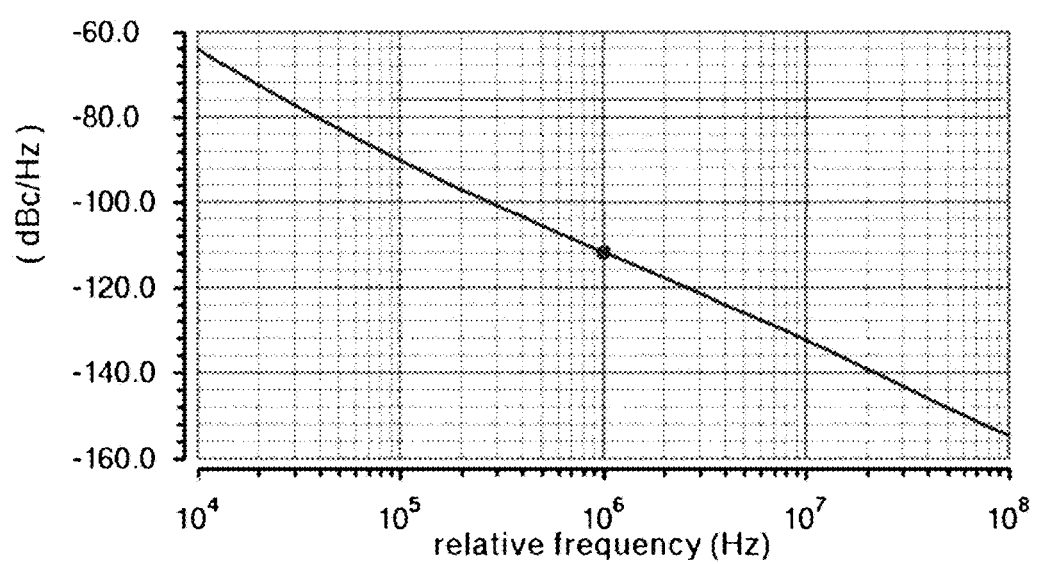
FIG. 5A is a curve diagram showing a relation of a phase noise and an offset frequency (or relative frequency) associated with the transformer feed-back QVCO which operates at a minimum operating frequency.
Figure 5B:
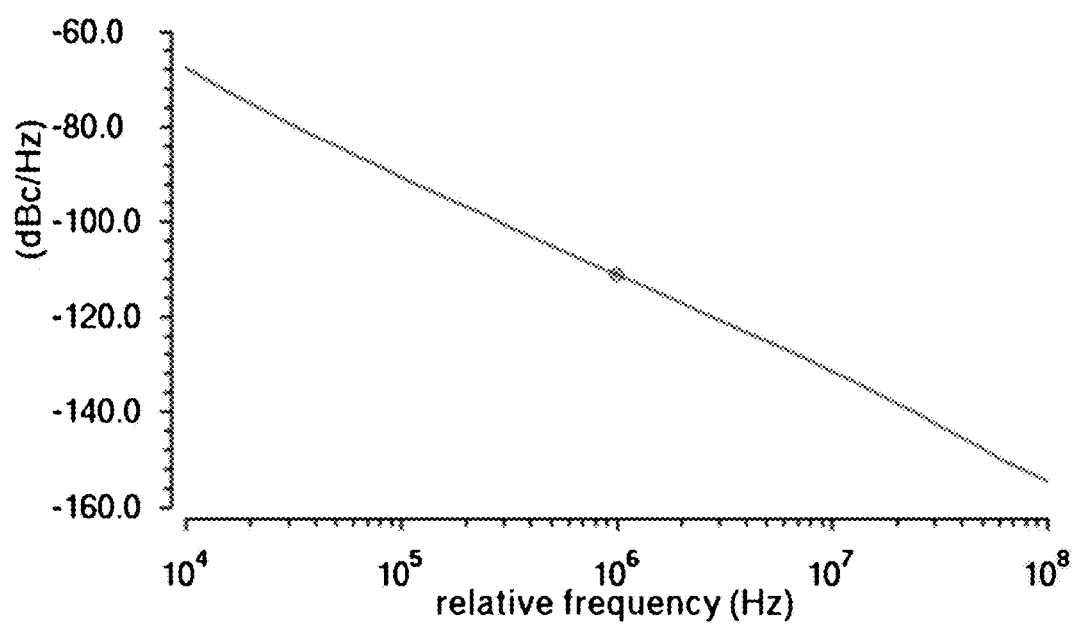
FIG. 5B is a curve diagram showing a relation of a phase noise and an offset frequency (or relative frequency) associated with the transformer feed-back QVCO which operates at a maximum operating frequency.

Referring to FIG. 5A and FIG. 5B, FIG. 5A is a curve diagram showing a relation of a phase noise and an offset frequency (or relative frequency) associated with the transformer feed-back QVCO which operates at a minimum operating frequency, and FIG. 5B is a curve diagram showing a relation of a phase noise and an offset frequency (or relative frequency) associated with the transformer feed-back QVCO which operates at a maximum operating frequency.

From FIG. 5A, the phase noise is −111.75 dBc/Hz (i.e. about −110 dBc/Hz) at the frequency offset being 1 MHz when the transformer feed-back QVCO operates at a minimum operating frequency, and from FIG. 5B the phase noise is −111.055 dBc/Hz (i.e. about −110 dBc/Hz) at the frequency offset being 1 MHz when the transformer feed-back QVCO operates at a minimum operating frequency. That is, compared with the conventional QCVO, the phase noise of the transformer feed-back QCVO 2 of FIG. 3 is decreased.

Figure 6A:
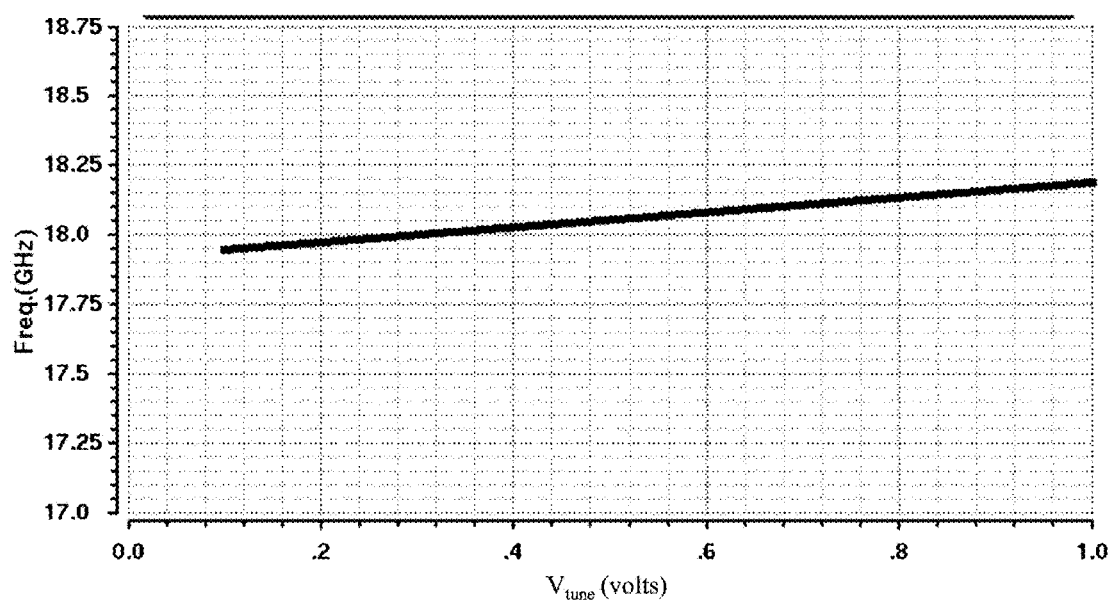
FIG. 6A is a curve diagram showing a relation of an operating frequency and a frequency tuning voltage associated with the transformer feed-back QVCO without a switching capacitor device.
Figure 6B:
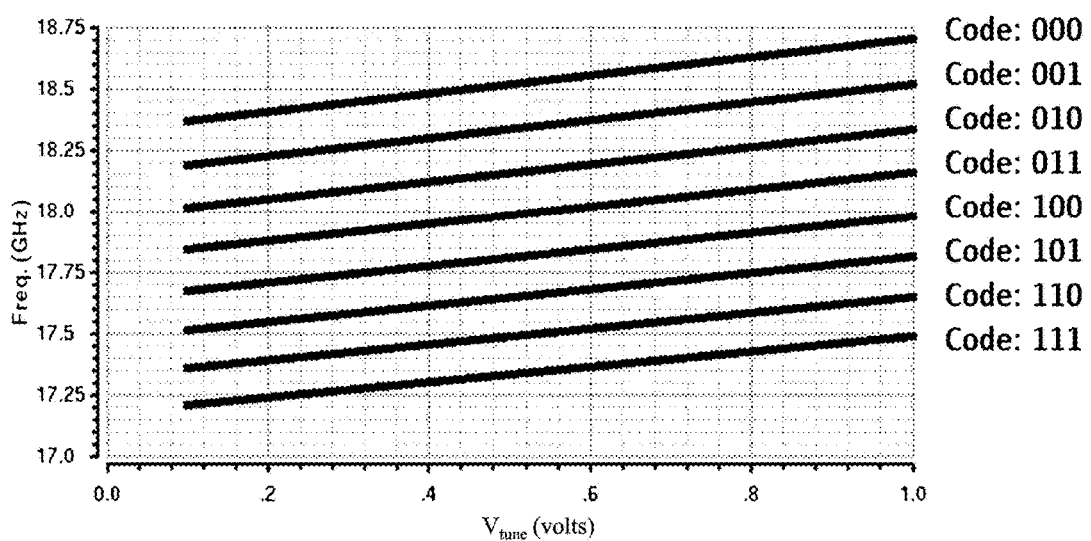
FIG. 6B is a curve diagram showing a relation of an operating frequency and a frequency tuning voltage associated with the transformer feed-back QVCO having a switching capacitor device to which different codes are given.

Next, referring to FIG. 6A and FIG. 6B, FIG. 6A is a curve diagram showing a relation of an operating frequency and a frequency tuning voltage associated with the transformer feed-back QVCO without a switching capacitor device, and FIG. 6B is a curve diagram showing a relation of an operating frequency and a frequency tuning voltage associated with the transformer feed-back QVCO having a switching capacitor device to which different codes are given.

From FIG. 6A, when the switching capacitor device is not used in the transformer feed-back QVCO, the frequency-voltage curve cannot be shifted, and the logarithm linear range is not wide. From FIG. 6B, the three bits (i.e. control signals for switches S1 through S3) of code can be 000 through 111, and thus the frequency-voltage curve can be shifted according to the code (i.e. equivalently, 8 frequency-voltage curves can be selected), and the logarithm linear range is enhanced (i.e. about 4 times, while compared to FIG. 6A).

Figure 7:
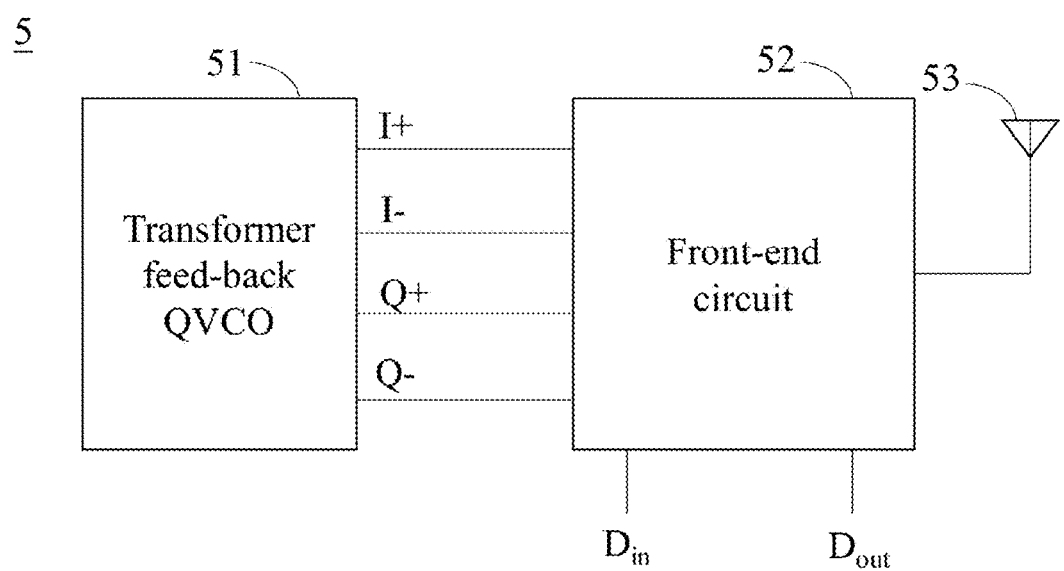
FIG. 7 is a block diagram of a communication apparatus according to an embodiment of the present disclosure.

Finally, referring to FIG. 7, FIG. 7 is a block diagram of a communication apparatus according to an embodiment of the present disclosure. The communication apparatus 5 can be used in 5G mobile communication, and the present disclosure does not limit the application of the communication apparatus 5. The communication apparatus 5 comprises a transformer feed-back QVCO 51, a front-end circuit 53 and an antenna 53, wherein the front-end circuit 53 is connected to the transformer feed-back QVCO 51 and the antenna 53.

The transformer feed-back QVCO 51 can be the transformer feed-back QVCO 7 or 2 of FIG. 2 or FIG. 3, and the present disclosure is not limited thereto. The transformer feed-back QVCO 51 provides the LO signals I+, I−, Q+, Q− of quadrature phases to the front-end circuit 52. The front-end circuit 52 in the embodiment is a transceiver circuit for generating RF signals of data signals $D_{in}$ to air and receiving RF signals of data signals $D_{out}$ from air through the antenna 53. However, the present disclosure does not limit the type of the front-end circuit 52, and in other one embodiment, the front-end circuit 52 can be a receiver or transmitter circuit.

In collusion, the embodiments of the present disclosure provide a transformer feed-back QVCO and a communication apparatus using the same, wherein the transformer feed-back QVCO uses the body-source capacitor coupling manner for generating the LO signals of the quadrature phases. The coupling capacitors can form a dynamic phase error correction circuit for correcting phase error of the LO signals of the quadrature phases due to the coupling network of the transformer feed-back QVCO.

Furthermore, the transformer feed-back QVCO has the coupling network formed in the circuit interior of the transformer feed-back QVCO rather than on the output ends of the transformer feed-back QVCO, such that the output load is decreased, the operating frequency is increased, and the phase noise is decreased. In addition, the transformer feed-back QVCO can further has the switching capacitor devices, such that the frequency-voltage curve of the transformer feed-back QVCO can be shifted to increase the logarithm linear range and correct the phase offsets at different frequencies.

While the present disclosure has been described by means of specific embodiments, numerous modifications and variations could be made thereto by those skilled in the art without departing from the scope and spirit of the present disclosure set forth in the claims.

What is claimed is:

1. A transformer feed-back quadrature voltage controlled oscillator (QVCO), comprising:
    a first VCO;
    a second VCO; and
    a dynamic phase error correction circuit, having a plurality of coupling capacitors connected between the first and second VCOs, wherein the capacitances of the coupling capacitors are varied according to a digital control signal to correct a phase error of local oscillating (LO) signals of quadrature phases output by the first and second VCOs;
    wherein the transformer feed-back QCVO is formed by a first half circuit and a second half circuit, wherein each of the first and second half circuit comprises:
        a first coupling capacitor;
        a second coupling capacitor;
        an induction inductor;
        a NMOS transistor;
        a PMOS transistor; and
        a frequency tuning circuit, a first end thereof is connected to a first end of the induction inductor, a drain of the PMOS transistor and a gate of the NMOS transistor, and a second end thereof is connected to a second end of the induction inductor, a drain of the NMOS transistor and a gate of the PMOS transistor;
    wherein the induction inductors of the first and second half circuit form a transformer, a body of the PMOS transistor of the first half circuit is connected to a source of the PMOS transistor of the second half circuit through the first coupling capacitor of the first half circuit, a body of the NMOS transistor of the first half circuit is connected to a source of the NMOS transistor of the second half circuit through the second coupling capacitor of the first half circuit, a body of the PMOS transistor of the second half circuit is connected to a source of the NMOS transistor of the first half circuit through the first coupling capacitor of the second half circuit, a body of the NMOS transistor of the second half circuit is connected to a source of the PMOS transistor of the first half circuit through the second coupling capacitor of the second half circuit, the drains of the PMOS transistors and the NMOS transistors are used to output the LO signals of quadrature phases, and a LO frequency is determined by a frequency tuning voltage applied to the frequency tuning circuit based upon a frequency-voltage curve;
    wherein the first and second coupling capacitors of the first and second half circuits are the variable coupling capacitors of the dynamic phase error correction circuit, so as to form the dynamic phase error correction circuit, the NMOS transistor, the PMOS transistor and the induction inductor of the first half circuit form the first VCO, and the PMOS transistor and the induction inductor of the second half circuit form the second VCO.

2. The transformer feed-back QCVO according to claim 1, wherein each of the first half circuit and the second half circuit further comprises:
    a switching capacitor device, a first end thereof is connected to the first end of the frequency tuning circuit, and a second end thereof is connected to the second end of the frequency tuning circuit, wherein a code which is given to the switching capacitor is used to shift the frequency-voltage curve.

3. The transformer feed-back QCVO according to claim 1, wherein each of the first half circuit and the second half circuit further comprises:
    a first inductor, wherein the source of the PMOS transistor is connected to a system voltage through the first inductor; and
    a second inductor, wherein the source of the NMOS transistor is connected to a ground through the second inductor.

4. The transformer feed-back QCVO according to claim 1, wherein the frequency tuning comprises:
    a first and second variable capacitors;
    a first and second resistors; and a first and second capacitors;
wherein the frequency tuning voltage is applied to first ends of the first and second variable capacitors, a second end of the first variable capacitor is connected to second ends of the first resistor and the first capacitor, a second end of the second variable capacitor is connected to second ends of the second resistor and the second capacitor, a biasing voltage is applied to first ends of the first and second resistors, and first ends of the first and second resistors are respectively connected to the drains of the PMOS and NMOS transistors.

5. The transformer feed-back QCVO according to claim 4, wherein when the frequency tuning voltage increases, a capacitance of the first variable capacitor increases, and a capacitance of the second variable capacitor decreases.

6. The transformer feed-back QCVO according to claim 2, wherein the switching capacitor device comprises:
switches and capacitors, wherein each of switches is connected between two capacitors, each set of the switch and the corresponding capacitors is parallelly connected to other one set, and the code is used to turned on or off at least one of the switches.

7. The transformer feed-back QCVO according to claim 2, wherein a LO frequency is 17.2 GHz through 18.6 GHz.

8. The transformer feed-back QCVO according to claim 2, wherein the phase noise is about −110 dBc/Hz at a frequency offset being 1 MHz.

9. A communication apparatus, comprising:
a transformer feed-back QVCO;
a front-end circuit, connected to the transformer feed-back QVCO;
wherein the transformer feed-back QVCO comprises:
a first VCO;
a second VCO; and
a dynamic phase error correction circuit, having a plurality of coupling capacitors connected between the first and second VCOs, wherein the capacitances of the coupling capacitors are varied according to a digital control signal to correct a phase error of local oscillating (LO) signals of quadrature phases output by the first and second VCOs;
wherein the transformer feed-back QCVO is formed by a first half circuit and a second half circuit, wherein each of the first and second half circuit comprises:
a first coupling capacitor;
a second coupling capacitor;
an induction inductor;
a NMOS transistor;
a PMOS transistor; and
a frequency tuning circuit, a first end thereof is connected to a first end of the induction inductor, a drain of the PMOS transistor and a gate of the NMOS transistor, and a second end thereof is connected to a second end of the induction inductor, a drain of the NMOS transistor and a gate of the PMOS transistor;
wherein the induction inductors of the first and second half circuit form a transformer, a body of the PMOS transistor of the first half circuit is connected to a source of the PMOS transistor of the second half circuit through the first coupling capacitor of the first half circuit, a body of the NMOS transistor of the first half circuit is connected to a source of the NMOS transistor of the second half circuit through the second coupling capacitor of the first half circuit, a body of the PMOS transistor of the second half circuit is connected to a source of the NMOS transistor of the first half circuit through the first coupling capacitor of the second half circuit, a body of the NMOS transistor of the second half circuit is connected to a source of the PMOS transistor of the first half circuit through the second coupling capacitor of the second half circuit, the drains of the PMOS transistors and the NMOS transistors are used to output the LO signals of quadrature phases, and a LO frequency is determined by a frequency tuning voltage applied to the frequency tuning circuit based upon a frequency-voltage curve;
wherein the first and second coupling capacitors of the first and second half circuits are the variable coupling capacitors of the dynamic phase error correction circuit, so as to form the dynamic phase error correction circuit, the NMOS transistor, the PMOS transistor and the induction inductor of the first half circuit form the first VCO, and the PMOS transistor and the induction inductor of the second half circuit form the second VCO.

10. The communication apparatus according to claim 9, wherein each of the first half circuit and the second half circuit further comprises:
a switching capacitor device, a first end thereof is connected to the first end of the frequency tuning circuit, and a second end thereof is connected to the second end of the frequency tuning circuit, wherein a code which is given to the switching capacitor is used to shift the frequency-voltage curve.

11. The communication apparatus according to claim 9, wherein each of the first half circuit and the second half circuit further comprises:
a first inductor, wherein the source of the PMOS transistor is connected to a system voltage through the first inductor; and
a second inductor, wherein the source of the NMOS transistor is connected to a ground through the second inductor.

12. The communication apparatus according to claim 9, wherein the frequency tuning comprises:
a first and second variable capacitors;
a first and second resistors; and
a first and second capacitors;
wherein the frequency tuning voltage is applied to first ends of the first and second variable capacitors, a second end of the first variable capacitor is connected to second ends of the first resistor and the first capacitor, a second end of the second variable capacitor is connected to second ends of the second resistor and the second capacitor, a biasing voltage is applied to first ends of the first and second resistors, and first ends of the first and second resistors are respectively connected to the drains of the PMOS and NMOS transistors.

13. The communication apparatus according to claim 12, wherein when the frequency tuning voltage increases, a capacitance of the first variable capacitor increases, and a capacitance of the second variable capacitor decreases.

14. The communication apparatus according to claim 10, wherein the switching capacitor device comprises:
switches and capacitors, wherein each of switches is connected between two capacitors, each set of the switch and the corresponding capacitors is parallelly connected to other one set, and the code is used to turned on or off at least one of the switches.

15. The communication apparatus according to claim 9, further comprising:

an antenna, connected to the front-end circuit, wherein the front-end circuit is a transceiver circuit, a receiver circuit or a transmitter circuit.

16. The communication apparatus according to claim 10, wherein a LO frequency is 17.2 GHz through 18.6 GHz.

17. The communication apparatus according to claim 10, wherein the phase noise is about −110 dBc/Hz at a frequency offset being 1 MHz.

\* \* \* \* \*